United States Patent
Park et al.

(10) Patent No.: US 8,188,472 B2
(45) Date of Patent: May 29, 2012

(54) THIN FILM TRANSISTOR, METHOD OF MANUFACTURING THE SAME, AND FLAT PANEL DISPLAY HAVING THE SAME

(75) Inventors: Jae-chul Park, Seoul (KR); Chang-jung Kim, Yongin-si (KR); Sun-il Kim, Yongin-si (KR); I-hun Song, Seongnam-si (KR); Young-soo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 82 days.

(21) Appl. No.: 12/007,085

(22) Filed: Jan. 7, 2008

(65) Prior Publication Data
US 2008/0258141 A1 Oct. 23, 2008

(30) Foreign Application Priority Data

Apr. 19, 2007 (KR) .................... 10-2007-0038537

(51) Int. Cl.
*H01L 21/786* (2006.01)
(52) U.S. Cl. ....... 257/59; 257/43; 257/72; 257/E29.117; 257/E29.137
(58) Field of Classification Search .............. 257/43, 257/59, 72, 83, 347, 348, E29.117, E29.273, 257/E29.289, E29.137, 52, 57, 64, 66, E29.003; 313/42, 498, 499, 500; 349/42, 43; 438/104
See application file for complete search history.

(56) References Cited

U.S. PATENT DOCUMENTS

| | | | | |
|---|---|---|---|---|
| 6,180,438 B1 * | 1/2001 | Deane et al. | .............. | 438/149 |
| 6,184,946 B1 * | 2/2001 | Ando et al. | .............. | 349/42 |
| 6,600,524 B1 * | 7/2003 | Ando et al. | .............. | 349/43 |
| 6,620,719 B1 * | 9/2003 | Andry et al. | .............. | 438/597 |
| 2003/0013221 A1 * | 1/2003 | Kimura et al. | .............. | 438/30 |
| 2003/0213959 A1 * | 11/2003 | Lai | .............. | 257/67 |
| 2005/0274947 A1 * | 12/2005 | Chen et al. | .............. | 257/59 |
| 2006/0043377 A1 * | 3/2006 | Hoffman et al. | .............. | 257/72 |
| 2006/0108636 A1 * | 5/2006 | Sano et al. | .............. | 257/347 |
| 2006/0202203 A1 * | 9/2006 | Chen et al. | .............. | 257/59 |
| 2007/0072439 A1 * | 3/2007 | Akimoto et al. | .............. | 438/795 |

FOREIGN PATENT DOCUMENTS

JP 2002-289859 10/2002
KR 2006-0123765 12/2006

* cited by examiner

*Primary Examiner* — Cuong Q Nguyen
*Assistant Examiner* — Yosef Gebreyesus
(74) *Attorney, Agent, or Firm* — Harness, Dickey & Pierce, P.L.C.

(57) ABSTRACT

A thin film transistor (TFT), a method of manufacturing the TFT, and a flat panel display comprising the TFT are provided. The TFT includes a gate, a gate insulating layer that contacts the gate, a channel layer that contacts the gate insulating layer and faces the gate with the gate insulating layer therebetween, a source that contacts an end of the channel layer; and a drain that contacts an other end of the channel layer, wherein the channel layer is an amorphous oxide semiconductor layer, and each of the source and the drain is a conductive oxide layer comprising an oxide semiconductor layer having a conductive impurity in the oxide semiconductor layer. A low resistance metal layer can further be included on the source and drain. A driving circuit of a unit pixel of a flat panel display includes the TFT.

16 Claims, 7 Drawing Sheets

THIN FILM TRANSISTOR, METHOD OF MANUFACTURING THE SAME, AND FLAT PANEL DISPLAY HAVING THE SAME

CROSS-REFERENCE TO RELATED PATENT APPLICATION

This application claims the benefit of Korean Patent Application No. 10-2007-0038537, filed on Apr. 19, 2007, in the Korean Intellectual Property Office, the disclosure of which is incorporated herein in its entirety by reference.

BACKGROUND OF THE INVENTION

1. Field of the Invention

The present invention relates to a thin film transistor, a method of manufacturing the same, and a flat panel display having the thin film transistor.

2. Description of the Related Art

Thin film transistors (TFTs) are used for flat panel displays such as liquid crystal displays or organic light emitting diode (OLED) displays.

FIG. 1 shows a driving circuit of a unit pixel of a conventional flat panel display. As depicted in FIG. 1, two TFTs 10 and 12 and one capacitor 14 are used for driving each pixel. The first TFT 10 is a switching device and the second TFT 12 is a driving device. The first and second TFTs 10 and 12 have the same configuration.

FIG. 2 is a cross-sectional view of a configuration of the second TFT 12 when the second TFT 12 has a bottom gate structure.

Referring to FIG. 2, a gate 22 is formed on a substrate 20, and a gate insulating layer 24 covering the gate 22 is formed on the substrate 20. A channel layer 26 is formed above the gate 22. The channel layer 26 is located above the gate 22. The channel layer 26 is an amorphous silicon layer or a poly silicon layer. A source 28 and a drain 30, which contact the channel layer 26, are formed on the gate insulating layer 24. The source and drain 28 and 30 are metal layers, separated from each other, and contact different ends of the channel layer 26.

The second TFT 12 must have high stability so as not to be affected by current stress and have uniform device characteristics over the entire back plane of the display. The characteristics of the TFT are closely related to the channel layer 16.

If the channel layer of the second TFT 12 is an amorphous silicon layer, the second TFT 12 can have uniform device characteristics. In this case, each of the pixels can display an identical color on the entire region of the display. However, the color is very sensitive to current stress. Thus, if the second TFT 12 is operated for a long period of time, a threshold voltage Vth of the second TFT 12 increases. FIG. 3 shows an example of the increase in the threshold voltage Vth of a TFT.

More specifically, FIG. 3 is a graph showing the variation of the threshold voltage Vth of a TFT, in which the channel layer is an amorphous layer, according to the driving time. The variation of the threshold voltage Vth was measured by operating the TFT for 100 hours while maintaining the TFT at a temperature of 50° C.

Referring to FIG. 3, the threshold voltage Vth of the TFT in which the channel layer is an amorphous layer was increased to approximately 2.1 V after 100 hours of operation.

If the channel layer of the second TFT 12 is a poly silicon layer, the second TFT 12 is affected little by the current stress, however, the uniform device characteristics are reduced when compared to the case that the channel layer is an amorphous layer.

The device characteristics of the TFT when the channel layer is formed of amorphous silicon or poly silicon can be improved to some extent by configuring a compensation circuit in each of the pixels. However, even though the compensation circuit is configured, the improvement of the device characteristics is limited. Also, since the compensation circuit includes a few TFTs and a few capacitors, the number of devices is increased greater than the case depicted in FIG. 1. Thus, the manufacturing process becomes complicated, thereby increasing the manufacturing costs.

SUMMARY OF THE INVENTION

To solve the above and/or other problems, the present invention provides a thin film transistor (TFT) that ensures uniform device characteristics and increases stability in driving each pixel without including a compensation circuit.

The present invention also provides a method of manufacturing the TFT.

The present invention also provides a flat panel display that includes the TFT.

According to an aspect of the present invention, there is provided a thin film transistor (TFT) comprising: a gate; a gate insulating layer that contacts the gate; a channel layer that contacts the gate insulating layer and faces the gate with the gate insulating layer therebetween; a source that contacts an end of the channel layer; and a drain that contacts an other end of the channel layer; wherein the channel layer is an amorphous oxide semiconductor layer, and each of the source and the drain is a conductive oxide layer comprising an oxide semiconductor layer having a conductive impurity in the oxide semiconductor layer.

The TFT may further comprise a low resistance metal layer which is formed on the source and the drain.

The oxide semiconductor layer of the source and drain may have a basic composition identical to or different from that of the amorphous oxide semiconductor layer of the channel layer. The channel layer may be formed of one selected from the ZnO group oxide semiconductor consisting of a ZnO layer, an IZO layer, and a G-I-Z-O layer. The source and drain may be formed of one selected from the group consisting of a G-I-Z-O layer, an ITO layer, an IZO layer, a ZnO layer, and a TiO layer.

The gate may be a multiple layer in which a first MO layer, a metal layer, and a second Mo layer are sequentially stacked. The metal layer may be an Al layer or an Al—Nd layer.

According to another aspect of the present invention, there is provided a method of manufacturing a TFT comprising a gate, a channel layer, a source, and a drain, the method comprising: forming the channel layer on a lower film; and forming the source and drain respectively contacting either ends of the channel layer on the lower film, wherein the channel layer is formed of an amorphous oxide semiconductor layer, the source and the drain are formed of a conductive oxide layer, and the conductive oxide layer is formed by injecting a conductive impurity into an oxide semiconductor layer.

The method may further comprise forming an etch stopper having a width smaller than that of the channel layer on the channel layer prior to the forming of the source and drain.

The forming of the channel layer and the etch stopper may further comprise: (a) sequentially stacking the amorphous oxide semiconductor layer and an insulating layer that is to be patterned to the etch stopper on the lower film; (b) sequentially patterning the insulating layer and the amorphous oxide semiconductor layer to a shape identical to the channel layer; and (c) exposing the amorphous oxide semiconductor layer by removing a portion of the patterned insulating layer.

The operations (b) and (c) may be performed using a half-tone mask or a slit photomask.

A surface of the channel layer where the etch stopper is formed may be treated with oxygen plasma prior to the forming of the etch stopper.

A surface of the lower film may be washed prior to the forming of the channel layer.

A surface of the lower film may be washed prior to the forming of the channel layer.

The lower film may be a gate insulating layer covering laterals and an upper surface of the gate or a substrate.

The surface of the channel layer where the etch stopper is formed may be washed prior to forming the etch stopper. The washing may be consecutively performed using isopropyl alcohol (IPA) and pure deionized (DI) water or using acetone, IPA, and pure DI water.

The conductive oxide layer may be formed using a sputtering method in an oxygen-free atmosphere.

The forming of the source, the drain, and the low resistance metal layer may further comprises: (a) forming an etch stopper having a width smaller than that of the channel layer on the channel layer; (b) sequentially stacking the conductive oxide layer that cover the etch stopper and the channel layer, and the low resistance metal layer on the lower film; (c) forming a mask that defines the source and the drain on the low resistance metal layer;

(d) sequentially removing the low resistance metal layers and the conductive oxide layers around the mask; and (e) removing the mask.

The conductive impurity may be injected during the forming of the oxide semiconductor layers or after forming of the oxide semiconductor layers using an ion injection process.

The gate may be formed above or under the channel.

According to an aspect of the present invention, there is provided a flat panel display in which a driving circuit of a unit pixel comprises two TFTs and one capacitor, wherein the TFTs are the TFT according to the present invention.

The flat panel display may further comprise an etch stopper on a channel layer between a source and a drain. The flat panel display may further comprise a low resistance metal layer formed on the source and the drain.

The flat panel display may be a liquid crystal display (LCD) or an organic light emitting diode (OLED) display.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
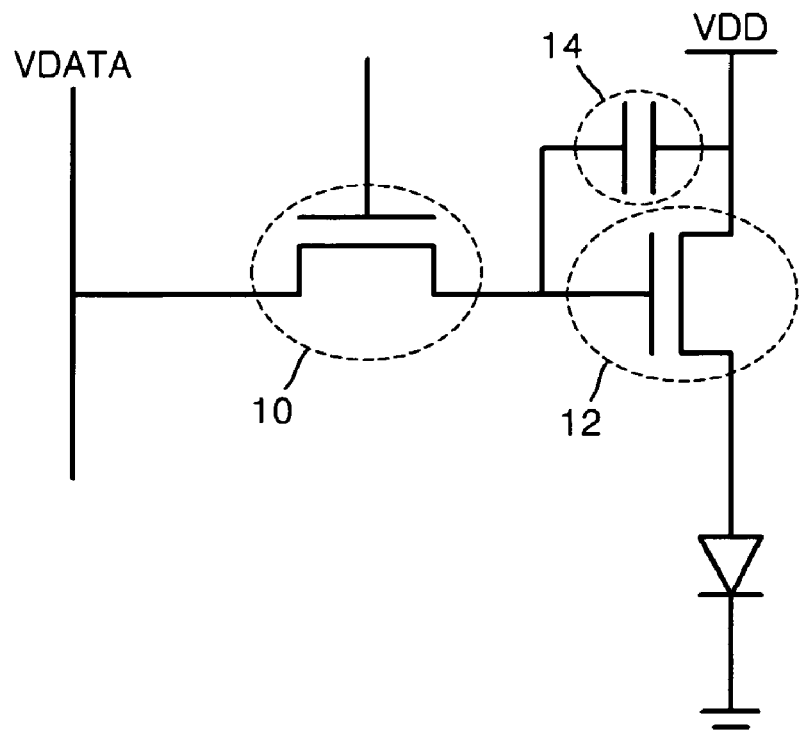
FIG. 1 shows a conventional circuit of a unit pixel of a flat panel display.
Figure 2:
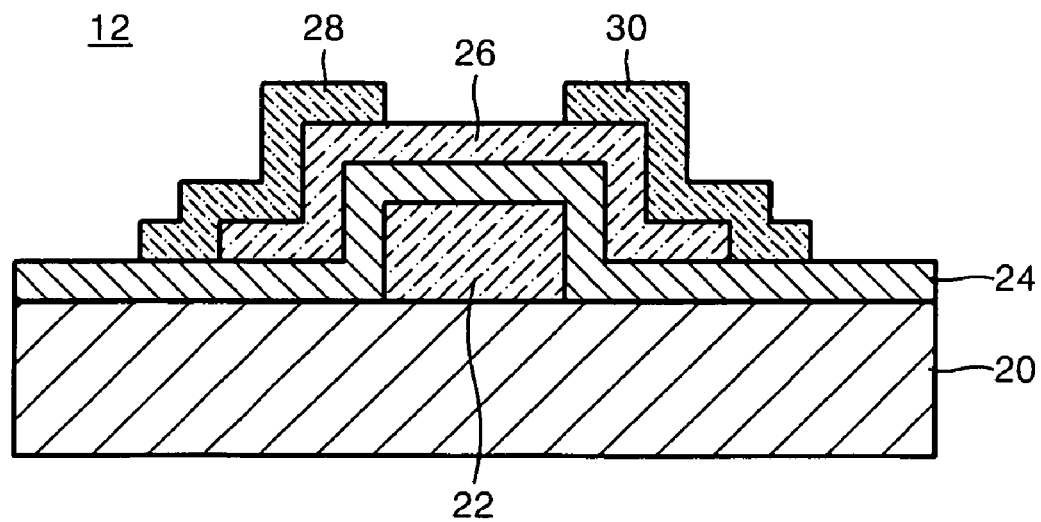
FIG. 2 is a cross-sectional view of a TFT included in the circuit of FIG. 1.
Figure 3:
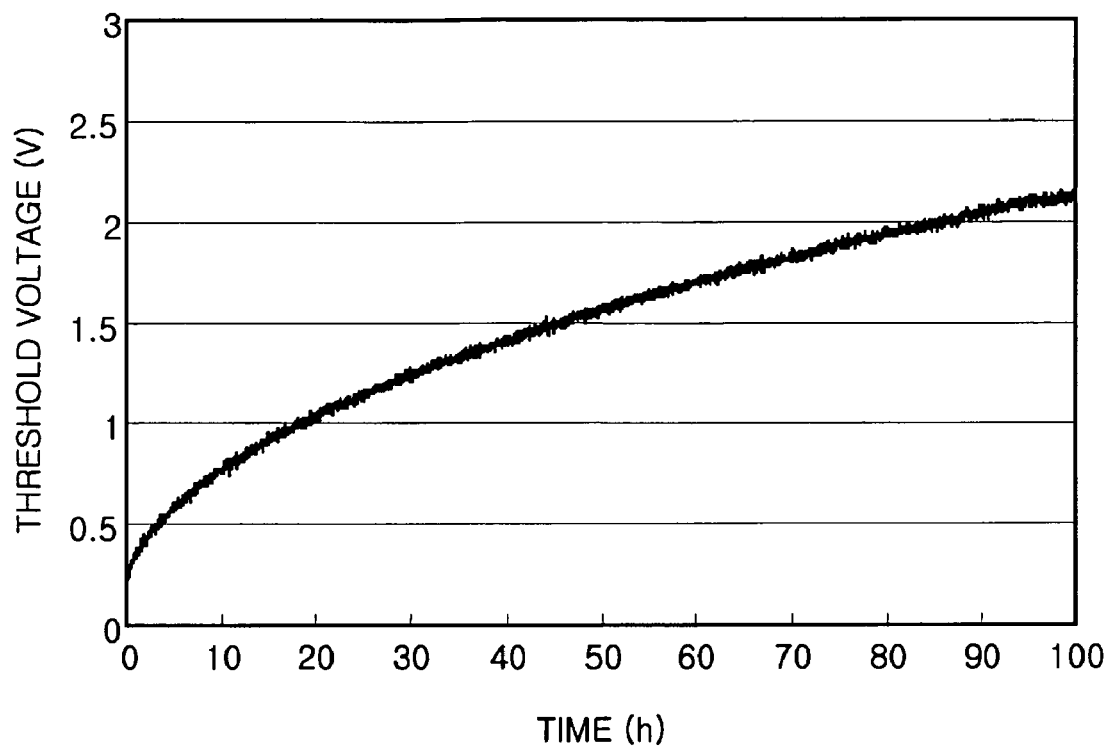
FIG. 3 is a graph showing the variation of threshold voltage of a TFT according to driving time, in which the channel layer is an amorphous layer.

A thin film transistor (TFT) according to the present invention, a method of manufacturing the TFT, and a flat panel display having the TFT will now be described more fully with reference to the accompanying drawings in which exemplary embodiments of the invention are shown. In the drawings, the thicknesses of layers and regions are exaggerated for clarity.

First, the TFT according to an embodiment of the present invention will now be described.

Figure 4:
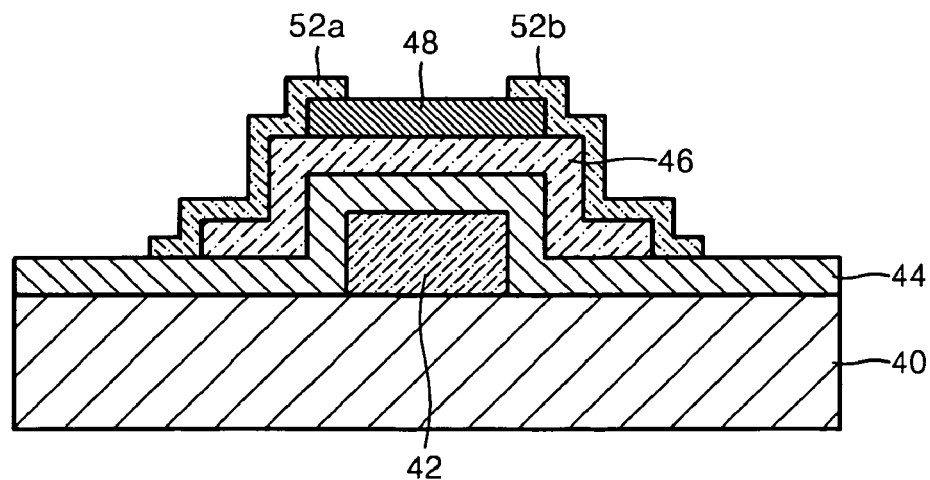
FIG. 4 is a cross-sectional view of a TFT according to an embodiment of the present invention.

FIG. 4 is a cross-sectional view of a TFT according to an embodiment of the present invention. Referring to FIG. 4, a gate 42 is formed on a substrate 40. The substrate 40 can be an insulating substrate, for example, a glass substrate. The gate 42 can be a single layer or a multiple layer. If the gate 42 is a single layer, the gate 42 can be a Mo layer or another metal layer different from the Mo layer. If the gate 42 is a multiple layer, the gate 42 can be a layer in which two or three metal layers are sequentially stacked. For example, the gate 42 can be a layer in which an Al layer and a Mo layer are sequentially stacked, or a first Mo layer, an Al layer, and a second MO layer are sequentially stacked. At this point, the Al layer can be replaced by an Al—Nd layer. A gate insulating layer 44 covering laterals and an upper surface of the gate 42 is formed on the substrate 40. The gate insulating layer 44 can be a silicon oxide layer or a silicon nitride layer. A channel layer 46 is formed on the gate insulating layer 44. The channel layer 46 is formed above the gate 42 and extends to both sides of the gate 42. The channel layer 46 can be an amorphous oxide semiconductor layer, for example, one of the ZnO group oxide semiconductor comprising a ZnO layer, an IZO layer, and a G-I-Z-O layer. An etch stopper 48 is formed on an upper surface of the channel layer 46. The etch stopper 48 can have a width on the channel layer 46 smaller than the width of the upper surface of the channel layer 46. The etch stopper 48 is formed to prevent the channel layer 46 from being damaged in a manufacturing process, and may be formed of a silicon oxide layer, for example. The etch stopper 48 can be selectively included. A source 52a and a drain 52b respectively are formed on either sides of the etch stopper 48. The source and drain 52a and 52b cover the channel layer 46 except for a portion of the channel layer 46 covered by the etch stopper 48. An upper end of each of the source and drain 52a and 52b contacts the etch stopper 48, and a lower end of each of the source and drain 52a and 52b contacts the gate insulating layer 44. The source and drain 52a and 52b can have the same basic composition as the channel layer 46, that is, a conductive oxide layer, for example, a ZnO layer, an indium zinc oxide (IZO) layer, or a G-I-Z-O layer. However, the conductive oxide layer further includes a predetermined conductive impurity that is not included in an oxide semiconductor layer used for forming the channel layer 46. The conductive impurity can be any element that can change the oxide semiconductor layer used for forming the channel layer 46 to a conductive material layer, for example, Al, B, Si, or In.

However, the source and drain 52a and 52b can be another conductive oxide layer having a composition different from the oxide semiconductor layer used for forming the channel layer 46. For example, the source and drain 52a and 52b can be an indium tin oxide (ITO) layer, a TiO layer, or a GaO layer.

Figure 10:
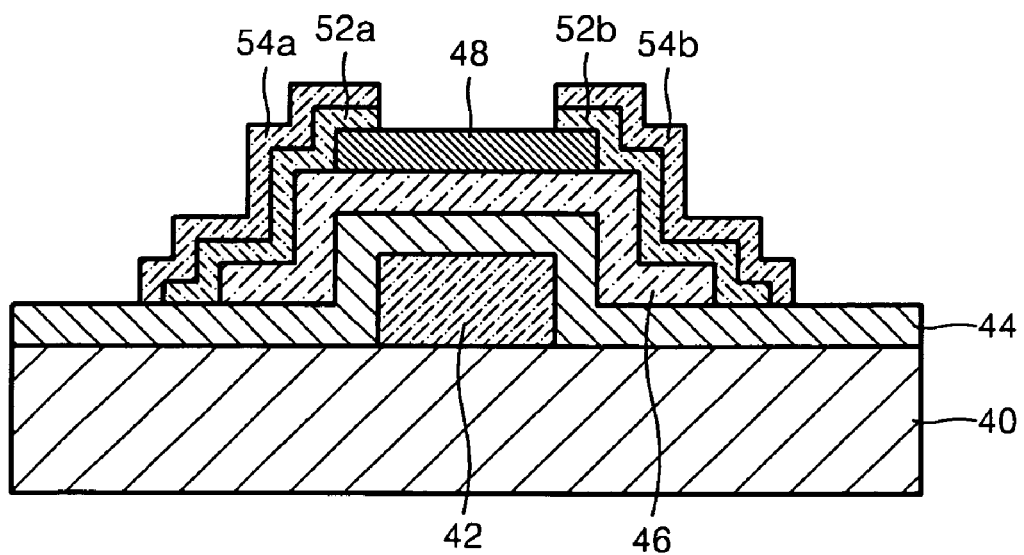

As depicted in FIG. 10, first and second metal layers 54a and 54b having a low resistance can further be formed on the source and drain 52a and 52b. The first and second metal layers 54a and 54b may mitigate or prevent the increase in resistance of the source and drain 52a and 52b when the resistance of the source and drain 52a and 52b increases in case of the source and drain 52a and 52b are formed of a conductive oxide layer. The first and second metal layers 54a and 54b can be a single layer or a multiple layer. If each of the first and second metal layers 54a and 54b is a single layer, the first and second metal layers 54a and 54b can be a Mo layer or another metal layer different from the Mo layer. If each of the first and second metal layers 54a and 54b is a multiple layer, each of the first and second metal layers 54a and 54b can be a metal layer in which two or three metal layers are sequentially stacked. For example, the first metal layer 54a can be a layer in which an Al layer and a Mo layer are sequentially stacked. Also, the first metal layer 54a can have a structure in which a first Mo layer, an Al layer, and a second Mo layer are sequentially stacked. At this point, the Al layer can be replaced by an Al—Nd layer. The multiple layer structure of the first metal layer 54a can also be applied to the second metal layer 54b.

A method of manufacturing a TFT according to an embodiment of the present invention will now be described with reference to FIGS. 5 through 10. Elements that constitute the TFT have been described with reference to FIG. 4, thus, the descriptions thereof will not be repeated.

Figure 5:
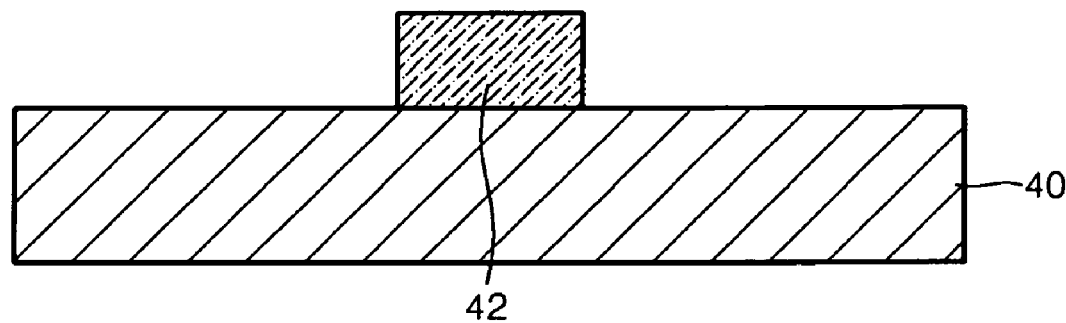
FIGS. 5 through 10 are cross-sectional views illustrating a method of manufacturing the TFT of FIG. 4.

Referring to FIG. 5, a gate 42 is formed on a substrate 40. The gate 42 can be a single layer or multiple layers. The single layer or each of the multiple layers forming the gate 42 may be sequentially formed on the substrate 40 using a sputtering method, and the gate 42 can be formed by patterning the single layer or the multiple layers.

Figure 6:
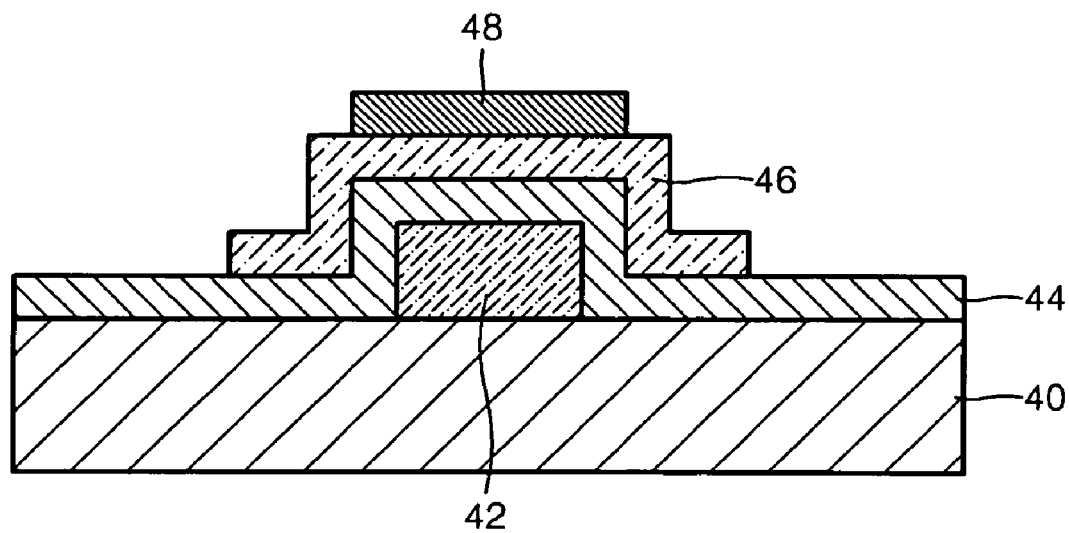
Figure 12:
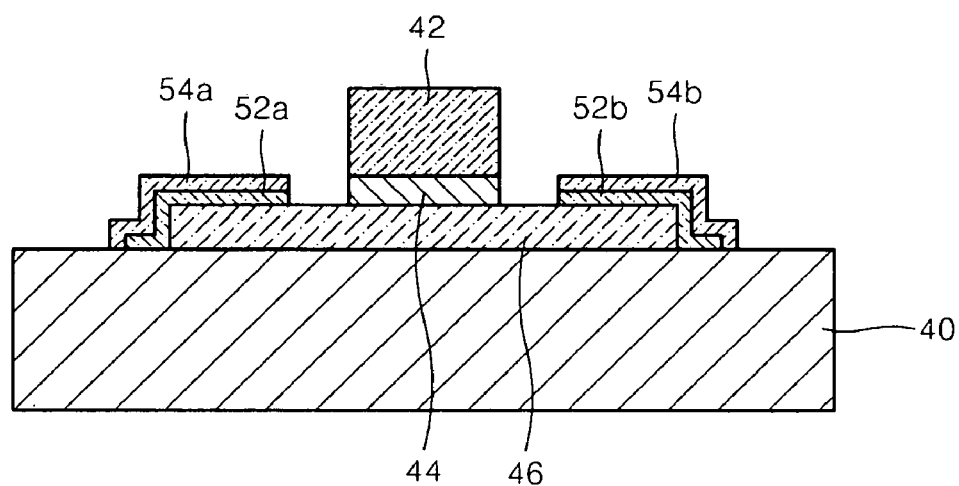
FIG. 12 shows the gate above the channel layer.

Referring to FIG. 6, a gate insulating layer 44 covering laterals and an upper surface of the gate 42 is formed on the substrate 40. The gate insulating layer 44 can be formed using a sputtering method or a chemical vapour deposition (CVD) method. A channel layer 46 is formed on the gate insulating layer 44 so that the center of the channel layer 46 can be located above the gate 42. Alternatively, as shown in FIG. 12, the gate 42 may be above the channel layer 46. The channel layer 46 can be extended in a form to cover the gate 42. The channel layer 46 can be deposited using a sputtering method or other methods. An etch stopper 48 is formed on the channel layer 46. The etch stopper 48 is formed to protect a portion of the channel layer 46 not covered by a source and a drain from being damaged in a subsequent process. Therefore, the etch stopper 48 is formed on a portion of the channel layer 46 that will be exposed between the source and drain. The etch stopper 48 is formed on the upper surface of the channel layer 46, however, the etch stopper 48 has a width smaller than the width of the upper surface of the channel layer 46. The etch stopper 48 can be formed using a sputtering method or a CVD method.

The forming process of the gate insulating layer 44, the channel layer 46, and the etch stopper 48 can be changed by various methods.

For example, after sequentially stacking the gate insulating layer 44, an oxide semiconductor layer (not shown), which is to be patterned to the channel layer 46, and an insulating layer (not shown), which is to be patterned to the etch stopper 48, the insulating layer and the oxide semiconductor layer are sequentially patterned using a halftone mask or a slit photo mask. And, a portion of the patterned insulating layer covering the patterned oxide semiconductor layer that is to be contacted by the source and drain 52a and 52b is removed. Thus, the channel layer 46 and the etch stopper 48 as depicted in FIG. 6 are formed. The oxide semiconductor layer that is to be patterned to the channel layer 46 can be treated with oxygen plasma prior to forming the insulating layer which is to be patterned to the etch stopper 48.

As another example, oxide semiconductor layers (not shown) that are to be patterned to the gate insulating layer 44 and the channel layer 46 are sequentially stacked on the substrate 40. Afterwards, the channel layer 46 depicted in FIG. 6 is formed by patterning the oxide semiconductor layer. Next, an insulating layer (not shown) that is to be patterned to the etch stopper 48 is formed on the gate insulating layer 44 to cover the channel layer 46. After a photoresist film pattern (not shown) that defines the shape of the etch stopper is formed on the insulating layer, the insulating layer around the photoresist film pattern is etched. Then, the photoresist film pattern is removed. In this way, the etch stopper 48 having the shape as depicted in FIG. 6 is formed. A region where the oxide semiconductor layer is deposited, that is, an upper surface of the gate insulating layer 44 can be washed prior to depositing the oxide semiconductor layer which is to be patterned to the channel layer 46. The washing can be consecutively performed using isopropyl alcohol (IPA) and pure deionized (DI) water or using acetone, IPA, and pure DI water.

A resultant product on which the channel layer 46 is formed can be treated with oxygen plasma prior to forming the insulating layer which is to be patterned to the etch stopper 48. The washing can be performed after the oxygen plasma treatment.

Figure 7:
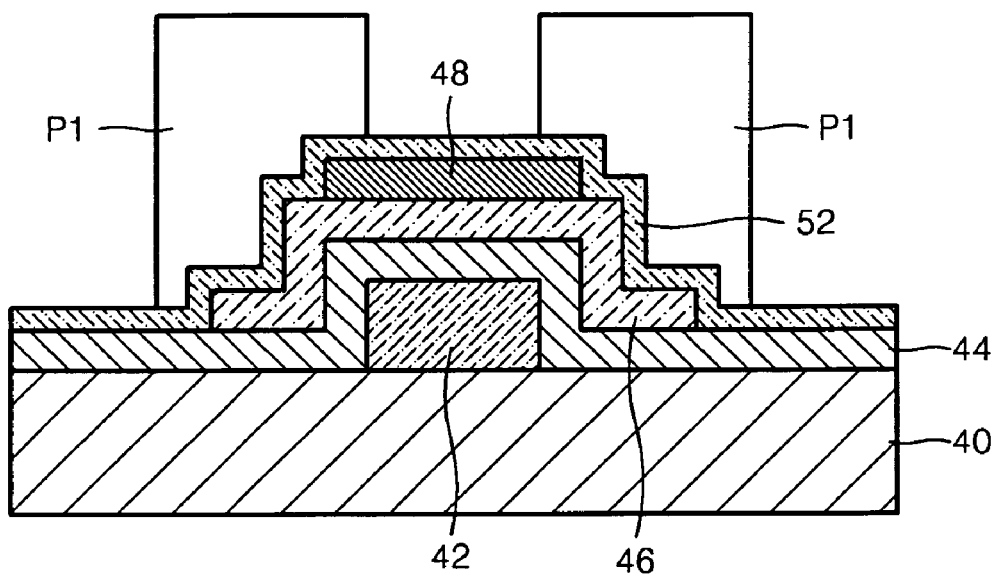

Referring to FIG. 7, after the etch stopper 48 is formed, a conductive oxide layer 52 that covers the etch stopper 48 and the channel layer 46 is formed on the gate insulating layer 44. The conductive oxide layer 52 can be formed using a sputtering method or can be formed by a different deposition method according to the composition of the conductive oxide layer 52. The conductive oxide layer 52 can be formed by injecting a predetermined impurity into a material layer (hereinafter, a first material layer) identical to the oxide semiconductor layer that is to be patterned to the channel layer 46. The conductive impurity can be injected into the first material layer using a co-sputtering method or an ion injection process. When the conductive impurity is injected using the ion injection process, the process of forming the conductive oxide layer 52 can include the process of forming the first material layer and the process of ion injecting the conductive impurity into the first material layer. The conductive oxide layer 52 can be an n+GIZO layer formed by a sputtering method under an oxygen-free atmosphere.

Figure 8:
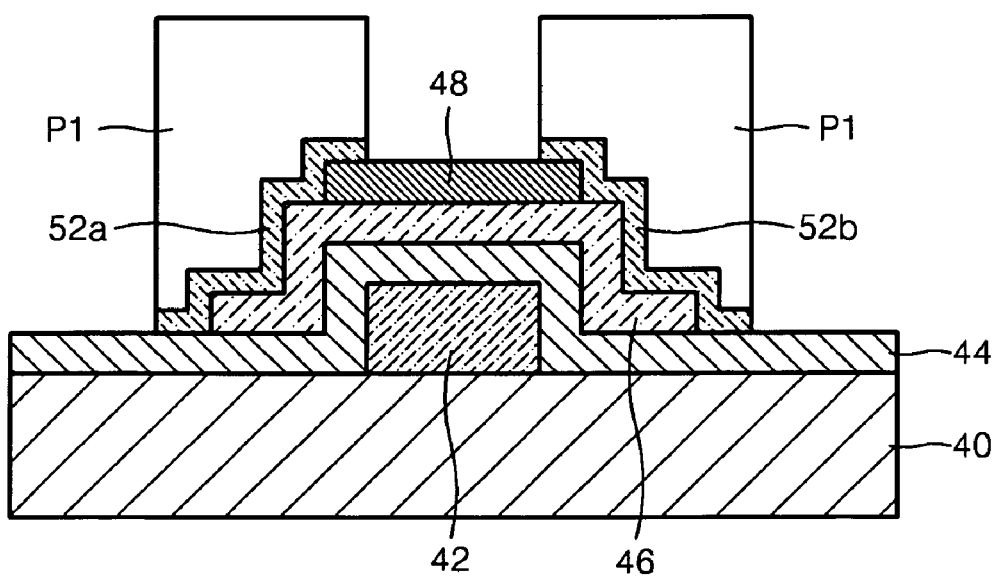
Figure 9:
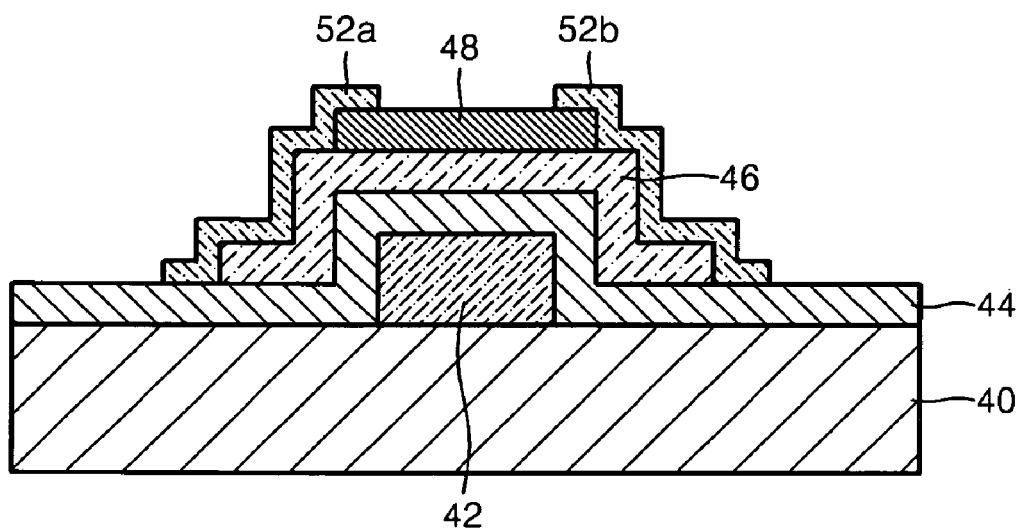

A photoresist film pattern P1 that defines a region where the source and drain 52a and 52b will be formed is formed on the conductive oxide layer 52. The exposed portion of the conductive oxide layer 52 is etched using the photoresist film pattern P1 as an etch mask. The etching can be wet etching or dry etching. The etching is continued until the gate insulating layer 44 and the etch stopper 48 are exposed. As a result of the etching, as depicted in FIG. 8, a separated conductive oxide pattern that contacts different portions of the channel layer 46, that is, the source and drain 52a and 52b are formed. The photoresist film pattern P1 is removed after the etching is completed. FIG. 9 shows a resultant product from which the photoresist film pattern P1 is removed, that is, a TFT according to the present embodiment.

Referring to FIG. 10, low resistance metal layers 54a and 54b can further be formed on the source and drain 52a and 52b formed of a conductive oxide. The low resistance metal layers 54a and 54b can be formed in a single layer or a multiple layer. If the low resistance metal layers 54a and 54b are further formed on the source and drain 52a and 52b, in the process depicted in FIG. 7, after a metal layer (not shown) that is to be patterned to the low resistance metal layers 54*a* and 54*b* is formed on the conductive oxide layer 52, the metal layer and the conductive oxide layer 52 can be sequentially etched by wet etching and dry etching. In the case of wet etching, the metal layer and the conductive oxide layer 52 can be sequentially etched using an etchant for the metal layer. For example, the conductive oxide layer 52 is an ITO layer and the metal layer is a multiple layer formed of a first Mo layer, an Al layer, and a second Mo layer, the conductive oxide layer 52 can be etched using a wet etchant that can etch the metal layer.

A TFT manufactured by a method according to the present embodiment as described above has a very low threshold voltage variation during operation, and thus, the operational stability of the TFT increases. In order to prove the uniform device characteristics of the TFT, the following experiment was performed.

For the experiment, a first specimen TFT and a second specimen TFT were manufactured. The first specimen TFT is a conventional TFT, and the source and drain are formed of a metal, for example, Mo. The second specimen TFT is the TFT according to the present embodiment, and the source and drain are formed of a conductive oxide, for example, n+GIZO. However, in the case of the second specimen TFT, a Mo layer was further formed as an auxiliary on the source and drain. Other configurations of the first specimen TFT and the second specimen TFT are identical.

Figure 11:
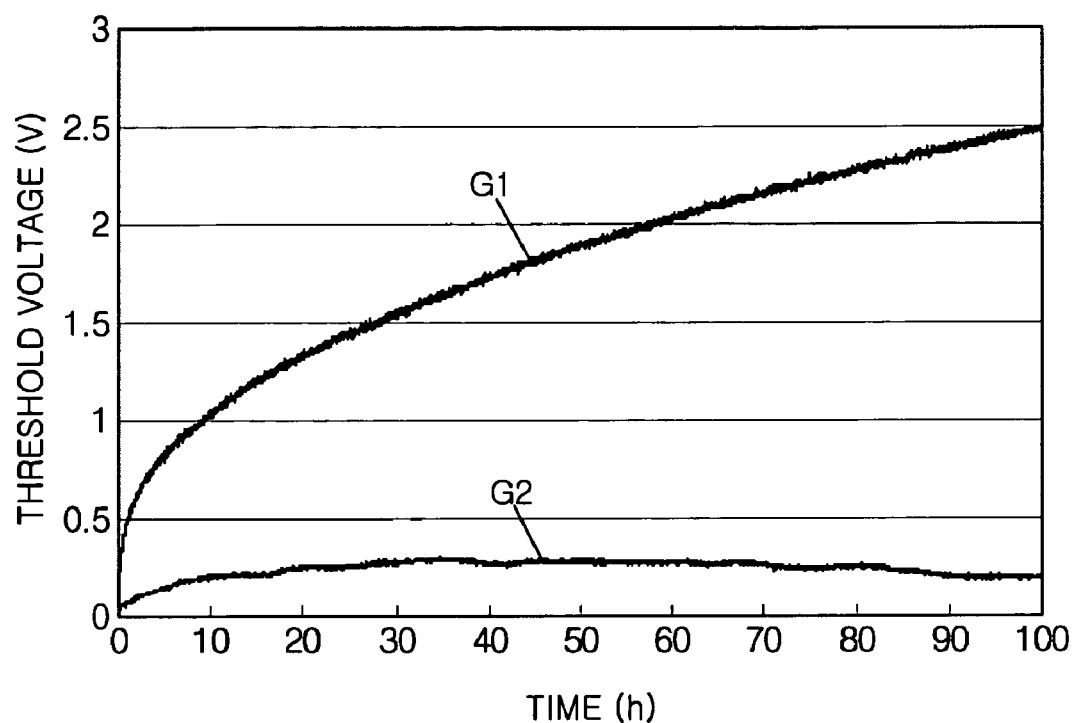
FIG. 11 is a graph showing the variation of a threshold voltage with the driving time of a TFT according to an embodiment of the present invention.

In order to measure the resistance of the first and second TFTs with respect to a current stress according to operation, that is, to measure the variation of threshold voltage according to operation, the variations of the threshold voltages were measured by operating the first and second TFTs for 100 hours. FIG. 11 shows the measurement results of the variation of the threshold voltages.

A first graph G1 of FIG. 11 shows the measurement result of the first specimen TFT, and a second graph G2 of FIG. 11 shows the measurement result of the second specimen TFT.

When the first and second graphs G1 and G2 are compared, in the case of the first specimen TFT in which the source and drain are formed of a metal, the threshold voltage of the first specimen TFT increases to 2.5V after the first specimen TFT was operated for 100 hour.

However, in the case of the second specimen TFT in which the source and drain are formed of n+GIZO which is an example of conductive oxide, after 100 hours of operation of the second specimen TFT, the variation of the threshold voltage is as small as 0.2V.

From the measurement results of FIG. 11, the TFT that uses a conductive oxide layer as the source and drain, according to the present embodiment has much greater stability when compared to the conventional TFT.

The TFT described above has a bottom gate structure in which the gate is formed below the channel layer. However, the present invention can also be applied to a TFT having a top gate structure in which the gate is formed above the channel. In particular, the structural and manufacturing aspects of the TFT having a bottom gate structure with respect to the source and drain can also be applied to a TFT having a top gate structure. The top gate structure of a TFT is well known in the art, thus, the description thereof will be omitted.

The TFT according to the present embodiment described above can be used instead of the TFT 10 and 12 (refer to FIG. 1) of a driving circuit of a pixel of a flat panel display such as a liquid crystal display (LCD) or an organic light emitting diode (OLED). The configuration of the LCD and OLED display is well known in the art, thus, the description thereof will be omitted.

As described above, in a TFT according to the present invention, a channel layer is formed of an amorphous oxide semiconductor and a source and a drain are formed of a conductive oxide. At this point, the basic composition of the conductive oxide layer is identical to the oxide semiconductor layer that is used for forming the channel layer. However, the conductive oxide layer includes a conductive impurity that is not included in the oxide semiconductor layer.

As described above, the channel layer of the TFT according to the present invention is an amorphous oxide semiconductor layer. Thus, if the TFT according to the present invention is applied to a flat panel display such as an LCD or an OLED, a uniform device characteristic of the flat panel display can be ensured. Also, since the source and drain of the TFT according to the present invention are formed of conductive oxide, the stability of the TFT can be increased. Therefore, when the TFT according to the present invention is applied to a flat panel display, the lifetime of the flat panel display can be increased compared when a conventional TFT is applied to the flat panel display.

In the case of the TFT according to the present invention, the channel layer is amorphous, and as depicted in FIG. 11, the variation of threshold voltage is as low as 0.2V. Therefore, if two TFTs of a driving circuit of a unit pixel that comprises the two TFTs and one capacitor are replaced by the TFTs according to the present invention, stability of the flat panel display can be increased without an additional compensation circuit and can ensure high uniform device characteristics.

Thus, if the TFT according to the present invention is applied to a flat panel display, a manufacturing process of the flat panel display can be simplified, thereby reducing the manufacturing costs.

While the present invention has been particularly shown and described with reference to embodiments thereof, it should not be construed as being limited to the embodiments set forth herein but as an exemplary. Those skilled in the art, for example, can change each of the elements that constitute the TFT to various shapes, can simply insert a new element between each of the elements, or an element can be formed to a multiple layer from a single layer. Therefore, the scope of the invention is defined not by the detailed description of the invention but by the appended claims.

What is claimed is:

1. A thin film transistor (TFT) comprising:
   a gate;
   a gate insulating layer contacting the gate;
   a channel layer contacting the gate insulating layer on a side opposite the gate, the channel layer including an amorphous oxide semiconductor layer;
   a source contacting a first end of the channel layer and consisting of a first conductive oxide layer;
   a drain contacting a second end of the channel layer and consisting of a second conductive oxide layer;
   a first low resistance metal layer on about the entire upper surface of the first conductive oxide layer; and
   a second low resistance metal layer on about the entire upper surface of the second conductive oxide layer.

2. The TFT of claim 1, wherein the first and second conductive oxide layers have a basic composition identical to that of the amorphous oxide semiconductor layer of the channel layer.

3. The TFT of claim 2, wherein the channel layer is one layer selected from the group consisting of a ZnO layer, an IZO layer, and a G-I-Z-O layer.

4. The TFT of claim 1, wherein the first and second conductive oxide layers have a basic composition different from that of the amorphous oxide semiconductor layer of the channel layer.

5. The TFT of claim 4, wherein the channel layer is one layer selected from the group consisting of a ZnO layer, an IZO layer, and a G-I-Z-O layer.

6. The TFT of claim 1, wherein the channel layer is one layer selected from the group consisting of a ZnO layer, an IZO layer, and a G-I-Z-O layer.

7. The TFT of claim 1, wherein the first and second conductive oxide layers are formed from one layer selected from the group consisting of a G-I-Z-O layer, an ITO layer, an IZO layer, a ZnO layer, and a TiO layer.

8. The TFT of claim 1, wherein the first and second conductive oxide layers include a conductive impurity.

9. The TFT of claim 8, wherein the conductive impurity is one selected from the group consisting of Al, In, B, and Si.

10. The TFT of claim 1, wherein the first and second low resistance metal layers include a plurality of layers.

11. The TFT of claim 1, wherein the gate is one of above and below the channel layer.

12. The TFT of claim 1, further comprising an etch stopper on the channel layer between the source and the drain.

13. The TFT of claim 1, wherein the gate is one of a single layer and a plurality of layers.

14. The TFT of claim 13, wherein the gate includes a first MO layer, a gate metal layer, and a second Mo layer.

15. The TFT of claim 14, wherein the gate metal layer is an Al layer or an Nd layer.

16. A thin film transistor (TFT) comprising:
   a gate;
   a gate insulating layer on the gate;
   a channel layer including an amorphous oxide semiconductor layer on the gate insulating layer, the gate insulating layer between the channel layer and the gate;
   a source on a first end of the channel layer, the source consisting of a first conductive oxide layer and a first low resistance metal layer, the first low resistance metal layer covering the entire upper surface of the first conductive oxide layer; and
   a drain on a second end of the channel layer, the drain consisting of a second conductive oxide layer and a second low resistance metal layer, the second low resistance metal layer covering the entire upper surface of the second conductive oxide layer.

* * * * *